(12) United States Patent
Kim et al.

(10) Patent No.: US 11,726,509 B1
(45) Date of Patent: Aug. 15, 2023

(54) SIGNAL RECEIVER ADAPTIVE TO NOISE LEVEL

(71) Applicant: ATTOWAVE CO., LTD., Seoul (KR)

(72) Inventors: Sungchul Kim, Gyeonggi-do (KR); Sanggil Park, Gyeonggi-do (KR)

(73) Assignee: ATTOWAVE CO., LTD., Seoul (KR)

( * ) Notice: Subject to any disclaimer, the term of this patent is extended or adjusted under 35 U.S.C. 154(b) by 0 days.

(21) Appl. No.: 17/740,810

(22) Filed: May 10, 2022

(30) Foreign Application Priority Data

Feb. 23, 2022 (KR) .................. 10-2022-0023366
Apr. 21, 2022 (KR) .................. 10-2022-0049316

(51) Int. Cl.
*G05F 1/46* (2006.01)
*H03K 5/24* (2006.01)

(52) U.S. Cl.
CPC .......... *G05F 1/46* (2013.01); *H03K 5/24* (2013.01)

(58) Field of Classification Search
CPC .... G01R 17/00; G01R 19/165; G01R 19/16566; H03K 5/153
USPC ............................................... 327/77
See application file for complete search history.

(56) References Cited

U.S. PATENT DOCUMENTS

| 8,309,926 B2 | 11/2012 | Borosak | |
| 2006/0214672 A1* | 9/2006 | Jenkins | G01R 31/3004 324/713 |
| 2014/0269956 A1* | 9/2014 | Chang | H04L 1/0031 375/346 |

FOREIGN PATENT DOCUMENTS

| KR | 102093041 B1 | 4/2020 |
| KR | 1020220013059 A | 2/2022 |

OTHER PUBLICATIONS

Korean Office Action dated Apr. 19, 2023 in counterpart Korean application 10-2022-0049316, 4 pages in Korean.

* cited by examiner

*Primary Examiner* — Quan Tra
(74) *Attorney, Agent, or Firm* — Juan Carlos A. Marquez; Marquez IP Law Office, PLLC

(57) ABSTRACT

A signal receiver adaptive to a noise level includes a first comparator, a second comparator, a control unit, and a reference voltage changing unit. The first comparator compares a voltage of a received signal with a first reference voltage, and the second comparator compares the voltage of the received signal with a second reference voltage. The control unit outputs a control voltage having a voltage level corresponding to the number of output pulses per unit time of the first comparator. The reference voltage changing unit changes the magnitudes of the first reference voltage and the second reference voltage in response to a voltage level of a control voltage. The second comparator compares the changed second reference voltage with the received signal to output a transmission signal from which noise is cancelled. A voltage level of noise to be cancelled from the received signal varies according to a noise level, so the noise cancellation adaptive to the noise level is performed.

5 Claims, 3 Drawing Sheets

SIGNAL RECEIVER ADAPTIVE TO NOISE LEVEL

CROSS-REFERENCE TO RELATED THE APPLICATION

This application is based on and claims priorities under 35 U.S.C. § 119 to Korean Patent Application Nos. 10-2022-0023366 filed on Feb. 23, 2022 and 10-2022-0049316 filed on Apr. 21, 2022 in the Korean Intellectual Property Office, the disclosure of which is incorporated by reference herein in its entirety.

BACKGROUND

1. Field of the Invention

The present invention relates to a signal receiver adaptive to a noise level, and more specifically, to a receiver for extracting a transmission signal by performing variable noise cancellation corresponding to a noise level from the transmission signal and a received signal including noise.

2. Discussion of Related Art

A receiver that receives a transmission signal transmitted from the outside, such as a laser pulse receiving circuit, extracts only the transmission signal by canceling noise included in the transmission signal.

In general, a voltage level of noise is lower than that of the transmission signal. Therefore, it is possible to extract a transmitted signal in which noise is removed, by canceling a signal lower than a certain voltage level from the received signal including transmitted signal and noise. However, such a method has a problem in that, when the voltage level to be cancelled is set to be too high, the reception sensitivity is lowered and the performance is deteriorated, and when the voltage level to be cancelled is set to be too low, the noise is not cancelled sufficiently. Therefore, the voltage level of the noise to be cancelled should be set carefully in consideration of both the noise cancellation effect and the transmission signal extraction. However, the noise varies according to the operating temperature, the usage environment, or the like, so the level of the noise is not maintained constant and varies continuously. Therefore, there is a need for a method of varying a voltage level of noise to be cancelled according to actual noise intensity.

Conventionally, a method of measuring a magnitude of noise and changing a voltage level of noise to be cancelled according to the measured magnitude has been used. In this case, it is general to measure a magnitude of noise level by using a peak voltage of a received signal or by using an RMS voltage.

RELATED ART DOCUMENT

Patent Document

U.S. Pat. No. 8,309,926 B2: Pulse-Laser Beam Detector with improved Sun and Temperature Compensation

SUMMARY OF THE INVENTION

The present invention provides a receiver that performs noise cancellation adaptive to a noise level by changing a voltage level of noise to be cancelled from a received signal according to the noise level.

The present invention provides a signal receiver adaptive to a noise level, comprising: a first comparator configured to compare a voltage of a received signal including noise and a transmission signal transmitted from an outside with a varying first reference voltage and outputting an output pulse according to the comparison result; a second comparator configured to extract the transmission signal in which the noise is cancelled, by comparing the voltage of the received signal with a varying second reference voltage that is higher than the first reference voltage; a control unit configured to output a control voltage having a voltage level corresponding to the number of the output pulses per unit time; and a reference voltage changing unit configured to change magnitudes of the first reference voltage and the second reference voltage in response to the voltage level of the control voltage.

The control unit can be constituted with an MCU configured to output a control signal using an error between the number of the output pulses and a predetermined reference number; and a DAC configured to convert the control signal into an analog signal to output the control voltage.

The MCU can generate the control signal by adopting a proportional control to the error.

The MCU can generate the control signal by adopting a proportional integral control to the error.

The reference voltage changing unit can be constituted by a voltage divider configured to divide the control voltage to generate the first reference voltage and the second reference voltage.

DETAILED DESCRIPTION OF EXEMPLARY EMBODIMENTS

Hereinafter, the present invention will be described in more detail with reference to the drawings.

Figure 1:
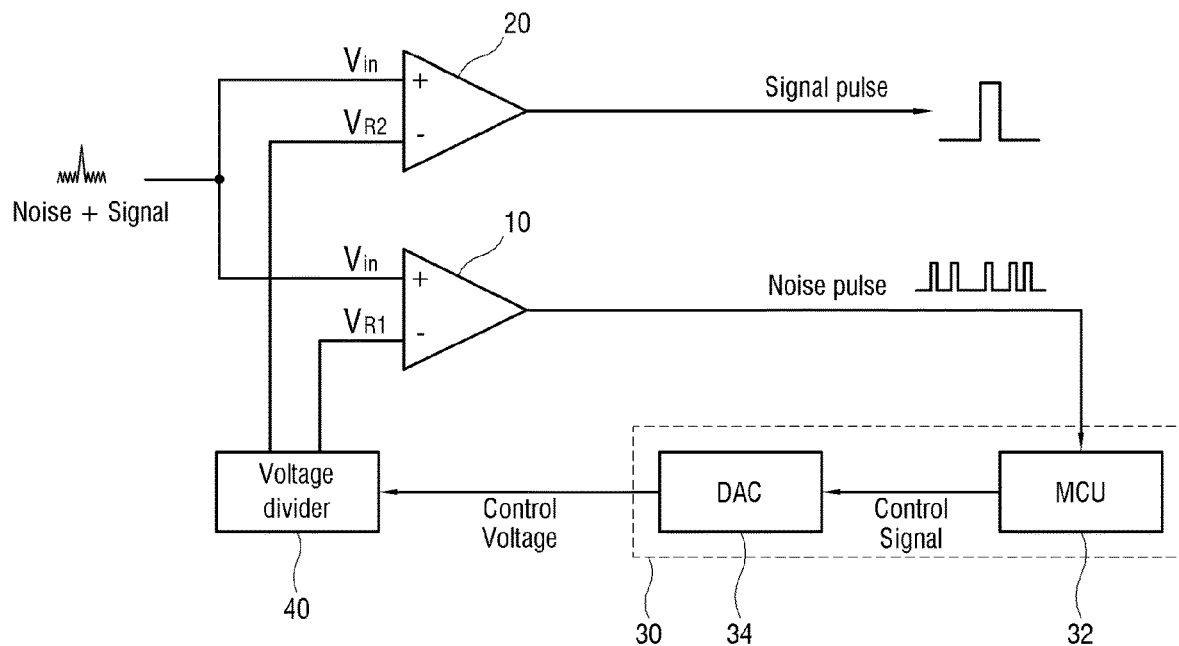
FIG. 1 is a block diagram of a signal receiver adaptive to a noise level according to the present invention.

FIG. 1 is a block diagram of a signal receiver adaptive to a noise level according to the present invention.

The receiver of the present invention is configured to include a first comparator 10, a second comparator 20, a control unit 30, and a reference voltage changing unit 40.

The first comparator 10 compares a received signal $V_{IN}$ with a first reference voltage $V_{R1}$ and outputs an output pulse according to the comparison result. Here, the received signal $V_{IN}$ includes a transmission signal transmitted from an external transmission device and noise generated during transmission and reception. The first reference voltage $V_{R1}$ adaptively varies to the noise level, as will be described later.

The second comparator 20 compares a voltage of the received signal $V_{IN}$ with a second reference voltage $V_{R2}$ and extracts the transmission signal from which the noise is cancelled. The second reference voltage $V_{R2}$ adaptively varies to the noise level, as will be described later.

The control unit 30 outputs a control voltage corresponding to the output pulse output from the first comparator 10. In this case, the control unit 30 outputs a control voltage having a voltage level corresponding to the number of output pulses per unit time. Specifically, the control unit 30 includes an MCU 32 configured with a microprocessor, and a DAC 34 configured with a digital-analog converter. The MCU 32 outputs a control signal using an error between the number of output pulses of the first comparator 10 and a predetermined reference number. As an example, the MCU 32 counts the number of output pulses for 100 μs, and outputs a digital signal corresponding to the counted number as a control signal. The DAC 34 converts a control signal output from the MCU 32 into an analog signal and outputs a control voltage.

The reference voltage changing unit 40 changes the magnitudes of the first reference voltage $V_{R1}$ and the second reference voltage $V_{R2}$ in response to the voltage level of the control voltage. Preferably, the reference voltage changing unit 40 includes a voltage divider that divides the control voltage output from the DAC 34 to generate the first reference voltage $V_{R1}$ and the second reference voltage $V_{R2}$. (Hereinafter, the reference voltage changing unit and the voltage divider are cited using the same reference numerals.)

As will be illustrated below, the first reference voltage $V_{R1}$ is used to measure the voltage level of the noise included in the received signal, and the second reference voltage $V_{R2}$ is used to eliminate the noise having the measured voltage level. Therefore, the second reference voltage $V_{R2}$ is higher than the first reference voltage $V_{R1}$. For example, the second reference voltage $V_{R2}$ can be set to be 20% higher than the first reference voltage $V_{R1}$. The voltage divider 40 divides the voltage input thereto as such.

Figure 2:
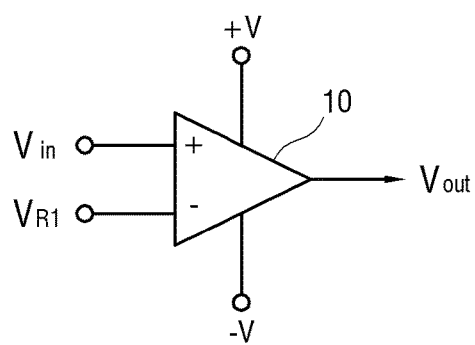
FIG. 2 is a diagram illustrating a first comparator of FIG. 1.

FIG. 2 is a diagram illustrating the first comparator 10 of FIG. 1. The first comparator 10 compares the received signal $V_{IN}$ with the first reference voltage $V_{R1}$ and outputs a pulse when the voltage level of the received signal $V_{IN}$ is higher than the first reference voltage $V_{R1}$. In this case, the magnitude of the first reference voltage $V_{R1}$ is changed by the controller 30 and the voltage divider 40.

Figure 3:
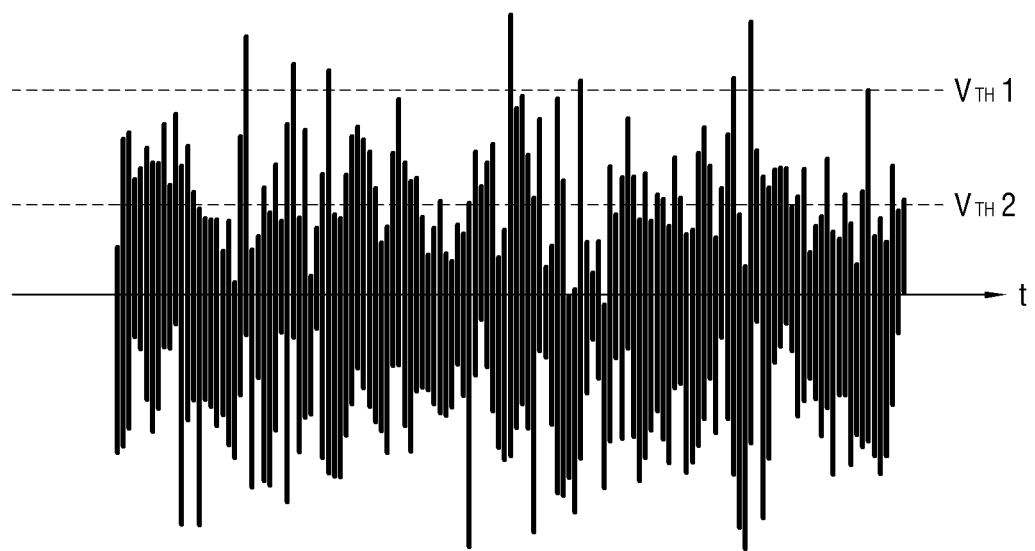
FIG. 3 is a diagram illustrating an example of a received signal input to the first comparator of FIG. 2.
Figure 4:
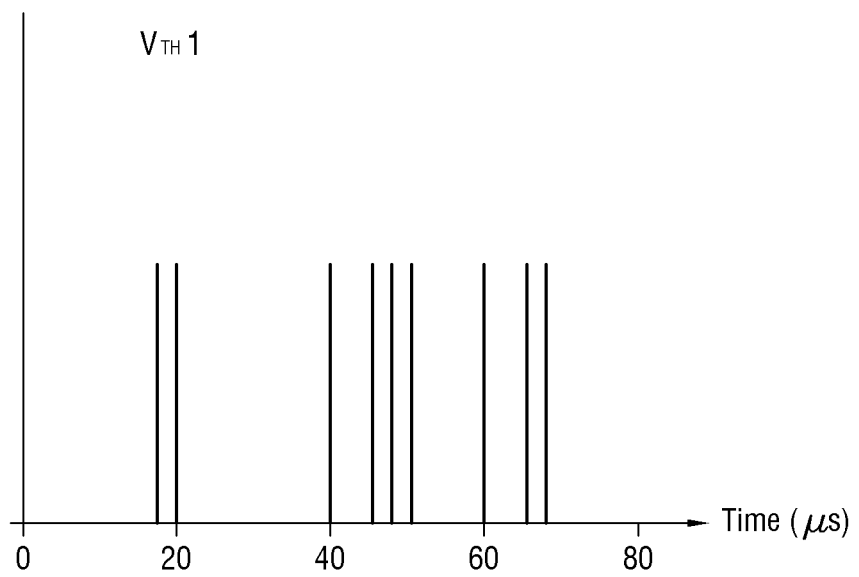
FIG. 4 is a diagram illustrating an output of the first comparator of FIG. 2 when a first reference voltage is set to be high with respect to the received signal of FIG. 3.
Figure 5:
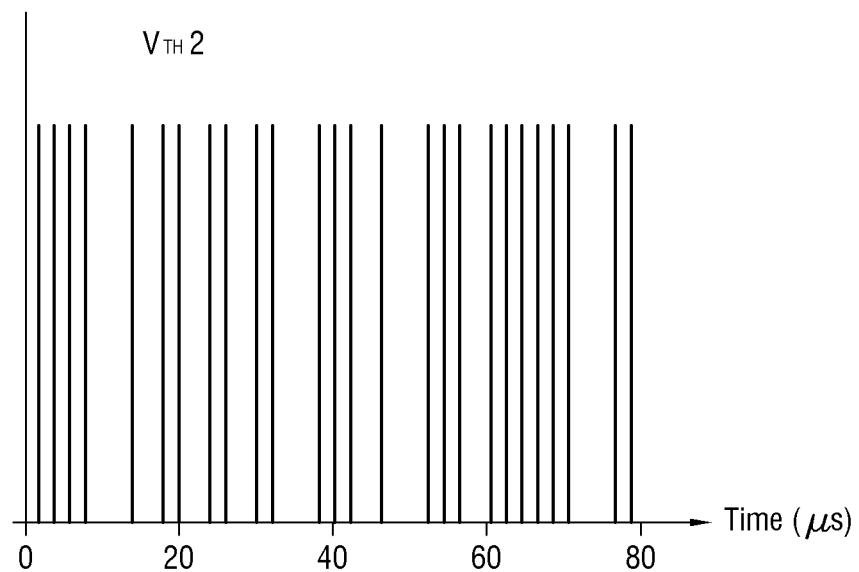
FIG. 5 is a diagram illustrating the output of the first comparator of FIG. 2 when the first reference voltage is set to low with respect to the received signal of FIG. 3.

FIG. 3 is a diagram illustrating an example of the received signal $V_{IN}$ input to the first comparator 10 of FIG. 2, and FIGS. 4 and 5 are diagrams illustrating examples of the output of the first comparator 10 in FIG. 3 respectively when the first reference voltage $V_{R1}$ is set to be high and when the first reference voltage $V_{R1}$ is set to be low during the received signal $V_{IN}$ is being input. When the first reference voltage $V_{R1}$ is set to be relatively high ($V_{TH}1$ of FIG. 3), the number of output pulses of the first comparator 10 decreases as illustrated in FIG. 4, and when the first reference voltage $V_{R1}$ is set to be relatively low ($V_{TH}2$ of FIG. 3), the number of output pulses of the first comparator 10 increases as illustrated in FIG. 5. Meanwhile, the output of the first comparator 10 is designated as "Noise Pulse" in FIG. 1, however the output of the first comparator 10 includes the noise pulses and the signal pulses since the voltage of the signal is higher than the voltage of the noise. However, the number of the signal per unit time is very low in comparison of the number of the noise per unit time, so the output of the first comparator 10 can be deemed as the Noise Pulse.

At first, the MCU 32 assumes a voltage level of noise in a normal state, and sets a control signal corresponding to the assumed voltage level. In this case, the voltage level has, for example, a value between $V_{TH}1$ and $V_{TH}2$ of FIG. 3. The control signal set in this way is changed to a control voltage by the DAC 34 and then the control voltage is supplied to the voltage divider 40, and the voltage divider 40 divides the control voltage to generate the first reference voltage $V_{R1}$ and the second reference voltage $V_{R2}$. In this case, the magnitudes of the generated first reference voltage $V_{R1}$ have the same as the noise level in the initially assumed normal state. The first comparator 10 outputs a output pulse when the received signal $V_{IN}$ having a larger magnitude than the first reference voltage $V_{R1}$ set in this way. Meanwhile, second reference voltage $V_{R2}$ is higher than the first first reference voltage $V_{R1}$. The second comparator 20 extracts the transmission signal from which the noise is removed, by removing the signal having the voltage lower than the second reference voltage $V_{R2}$ from the received signal $V_{IN}$.

In such a situation, when the noise increases for some reason, a signal with a voltage higher than the current first reference voltage $V_{R1}$ increases in the received signal $V_{IN}$, and thus, the number of output pulses of the first comparator 10 increases. The MCU 32 outputs a control signal corresponding to the increased number of output pulses, and the DAC 34 converts the control signal into an analog signal to output a control voltage having a higher voltage level. As the control voltage of the enhanced voltage level is divided by the voltage divider 40, the first reference voltage $V_{R1}$ and the second reference voltage $V_{R2}$ output from the voltage divider 40 are enhanced, for example, to $V_{TH}1$ of FIG. 3. Accordingly, the second comparator 20 removes the signal of the enhanced voltage level from the received signal $V_{IN}$. In this case, as the first reference voltage $V_{R1}$ is enhanced, the number of output pulses of the first comparator 10 decreases, so the MCU 32 outputs a control signal corresponding to the decreased number of output pulses, and the DAC 34 outputs a control voltage of a lowered voltage level. Accordingly, the first reference voltage $V_{R1}$ and the second reference voltage $V_{R2}$ are lowered to, for example, the initially set voltage level. This process is repeated at a constant cycle for each unit time, for example, every 100 μs.

On the other hand, when noise decreases for some reason, a signal with a voltage higher than the current first reference voltage $V_{R1}$ in the received signal $V_{IN}$ decreases, and thus, the number of output pulses of the first comparator 10 decreases. The MCU 32 outputs a control signal corresponding to the decreased number of output pulses, and the DAC 34 converts the control signal into an analog signal to output a control voltage having a lower voltage level. As the control voltage of the lowered voltage level is divided by the voltage divider 40, the first reference voltage $V_{R1}$ and the second reference voltage $V_{R2}$ output from the voltage divider 40 are lowered, for example, to $V_{TH}2$ of FIG. 3. Accordingly, the second comparator 20 removes the signal of the lowered voltage level from the received signal $V_{IN}$. In this case, as the first reference voltage $V_{R1}$ are lowered, the number of output pulses of the first comparator 10 increases, so the MCU 32 outputs a control signal corresponding to the increased number of high output pulses, and the DAC 34 outputs a control voltage of an enhanced voltage level. Accordingly, the first reference voltage $V_{R1}$ and the second reference voltage $V_{R2}$ are enhanced to, for example, the initially set voltage level.

As this process is repeated, when the noise increase, the noise level, which is the threshold value of filtering by the second comparator 20, is enhanced, and when the noise decreases, the noise level, which is the threshold value of filtering by the second comparator 20, is lowered. Since the noise level to be cancelled is adaptively changed according to the input noise level, the problem of deterioration of the noise filtering effect when applying an unchanged low noise level constantly and the problem of signal loss when applying a high unchanged noise level constantly are prevented.

Hereinafter, a specific method in which the MCU 32 generates the control signal corresponding to the number of output pulses of the first comparator 10 in the present invention will be described.

A predetermined reference number is set in advance for the number of output pulses of the first comparator 10 in the MCU 32. This reference number is, for example, set as the number of output pulses output from the first comparator 10 when noise of normal intensity is generated in a state where the initial first reference voltage $V_{R1}$ is set as described above. Therefore, the reference number is set as a target value that results in the most optimal noise cancellation performance, which the receiver of the present invention wants to adaptively track. This target value may be changed in consideration of the specific configuration of the receiver, the environment of the place where the receiver is installed, the general S/N ratio situation of the received signal received by the receiver, and the like.

The MCU 32 may calculate an error between the number of output pulses of the first comparator 10 and the reference number, and output, as control signal, a signal having a magnitude proportional to the error. That is, the MCU 32 generates the control signal by adopting a proportional control to the error as shown in the following equation.

$$Sc=Kp*e$$

(Sc: control signal, Kp: proportional constant, e: error)

The DAC 32 converts this control signal into the analog signal to output the control voltage.

When the control voltage is proportional to the error, the reference voltage changing unit 40 generates the voltage level of the DAC 32 to the initially set first reference voltage $V_{R1}$ to generate the first reference voltage $V_{R1}$ and the second reference voltage $V_{R2}$. Accordingly, the first reference voltage $V_{R1}$ and the second reference voltage $V_{R2}$ are enhanced according to the increased error.

This process is repeated at a constant cycle, for example, every 100 μs. When the error still has a positive (+) value even in the new cycle, the first reference voltage $V_{R1}$ and the second reference voltage $V_{R2}$ are further enhanced with the amount corresponding to the error according to the above process, and when the error has a negative (−) value, the first reference voltage $V_{R1}$ and the second reference voltage $V_{R2}$ are lowered with the amount corresponding to the error.

Meanwhile, the MCU 32 may generate the control signal by adopting a proportional integral control to an error as shown in the following equation in addition to the proportional control as described above.

$$Sc=Kp*e+Ki*\text{accumulator}$$

(Sc: control signal, Kp: proportional constant, Ki: integral constant, e: error, accumulator: accumulator as a cumulative value of an error calculated every cycle<=accumulator+e)

When this concept of proportional integral control is applied, the stability of the control is improved.

Meanwhile, in the configuration of FIG. 1, a separate time delay circuit for delaying the received signal $V_{IN}$ may be added to a front end of the second comparator 20. That is, the received signal $V_{IN}$ input to the second comparator 20 may be input after a predetermined time delay compared to the received signal $V_{IN}$ input to the first comparator 10. In this case, the delay time is preferably configured to be the same as the time required until the first reference voltage $V_{R1}$ and the second reference voltage $V_{R2}$ changed by the reference voltage changing unit 40 are finally generated using the received signal input to the first comparator 10. In this case, the reference voltage changing unit 40 changes the first reference voltage $V_{R1}$ and the second reference voltage $V_{R2}$ based on the signal input to the first comparator 10, and at the same time, the second comparator 20 performs the noise cancellation operation based on the changed second reference voltage $V_{R2}$. Accordingly, the second comparator 20 obtains the same effect as the noise cancellation operation is performed based on the measured noise level after the noise level is measured in advance.

Figure 6:
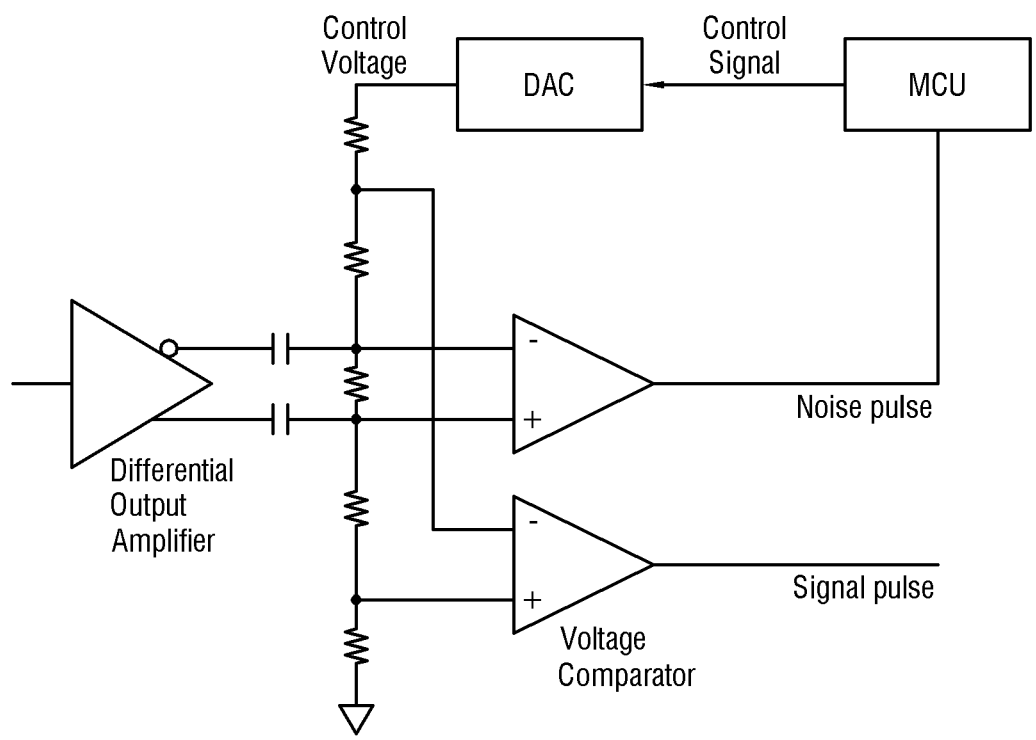
FIG. 6 is a diagram illustrating an actual implementation example of FIG. 1.

FIG. 6 is a diagram illustrating an actual implementation example of FIG. 1. In FIG. 6, same reference numerals are given to the same components as those of FIG. 1. In actual implementation example, in order to improve the S/N ratio, the received signal $V_{IN}$ is preferably configured to be output as an inverted and non-inverted signal through a differential output amplifier 50.

According to the present invention, noise cancellation adaptive to a noise level is performed by changing the voltage level of noise to be cancelled from a received signal according to the noise level.

Although the present invention has been described with reference to an embodiment illustrated in the accompanying drawings, it is only an example. It will be understood by those skilled in the art that various modifications and other equivalent exemplary embodiments are possible from the present invention. Therefore, the actual technical protection scope of the present invention is to be defined by the claims.

What is claimed is:

1. A signal receiver adaptive to a noise level, comprising:
a first comparator configured to compare a voltage of a received signal including noise and a transmission signal transmitted from an outside with a varying first reference voltage and outputting an output pulse according to the comparison result;
a second comparator configured to extract the transmission signal in which the noise is cancelled, by comparing the voltage of the received signal with a varying second reference voltage that is higher than the first reference voltage;
a control unit configured to output a control voltage having a voltage level corresponding to the number of the output pulses per unit time; and
a reference voltage changing unit configured to change magnitudes of the first reference voltage and the second reference voltage in response to the voltage level of the control voltage.

2. The signal receiver adaptive to a noise level of claim 1, wherein the control unit includes:
an MCU configured to output a control signal using an error between the number of the output pulses and a predetermined reference number; and
a DAC configured to convert the control signal into an analog signal to output the control voltage.

3. The signal receiver adaptive to a noise level of claim 2, wherein the MCU generates the control signal by adopting a proportional control to the error.

4. The signal receiver adaptive to a noise level of claim 2, wherein the MCU generates the control signal by adopting a proportional integral control to the error.

5. The signal receiver adaptive to a noise level of claim 1, wherein the reference voltage changing unit includes a voltage divider configured to divide the control voltage to generate the first reference voltage and the second reference voltage.

* * * * *